United States Patent [19]
Andreshak et al.

[11] Patent Number: 5,093,279
[45] Date of Patent: Mar. 3, 1992

[54] LASER ABLATION DAMASCENE PROCESS

[75] Inventors: Joseph C. Andreshak, Mahopac; Robert J. Baseman, Brewster, both of N.Y.

[73] Assignee: International Business Machines Corporation, Armonk, N.Y.

[21] Appl. No.: 653,209

[22] Filed: Feb. 1, 1991

[51] Int. Cl.$^5$ ............................................. H01L 21/88
[52] U.S. Cl. ................................ 437/173; 437/203; 437/228; 148/DIG. 93; 156/643; 156/664; 156/666; 427/53.1
[58] Field of Search ............... 437/173, 174, 225, 228, 437/19, 203; 148/DIG. 93, 55, 91, 17, 92, 94; 156/643, 664–666; 427/53.1

[56] References Cited

U.S. PATENT DOCUMENTS

| | | | |
|---|---|---|---|
| 4,674,176 | 6/1987 | Tuckerman | 148/DIG. 93 |
| 4,684,437 | 8/1987 | Donelon et al. | 156/643 |
| 4,758,533 | 7/1988 | Magee et al. | 437/908 |
| 4,789,648 | 12/1988 | Chow et al. | 437/238 |
| 4,920,070 | 4/1990 | Mukai | 437/194 |
| 4,998,239 | 3/1991 | Strandjord et al. | 369/275.01 |
| 5,024,968 | 6/1991 | Engelsberg | 437/907 |
| 5,032,233 | 7/1991 | Yu et al. | 427/53.1 |

FOREIGN PATENT DOCUMENTS 63-215055  9/1988  Japan ................................. 437/173

*Primary Examiner*—Olik Chaudhuri
*Assistant Examiner*—Andrew Griffis
*Attorney, Agent, or Firm*—Scully, Scott, Murphy & Presser

[57] ABSTRACT

A laser ablation damascene process for the planarizing of metal/polymer structures. More specifically, the process is especially adapted for the fabrication of both interlevel via metallization and circuitization layers in integrated circuit (IC) interconnects. Subsequent to the forming or etching of holes or depressions in a polymer insulating layer, a metal layer or film is deposited thereon for the purpose of fabricating vias or trenches for metallization and circulation layers in IC connects. Thereafter, the surface of the metal layer which has been deposited or superimposed on the polymer substrate through any suitable method known in the art is irradiated with at least one laser pulse which will cause the metal layer to melt and reflow and resultingly fill the vias and trenches etched in the polymer substrate while simultaneously ablating and removing the metal from the planarized surface of the substrate in the regions about the vias and trenches.

13 Claims, 4 Drawing Sheets

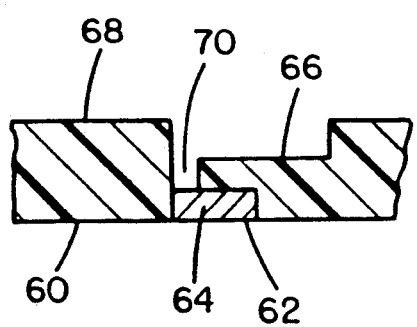
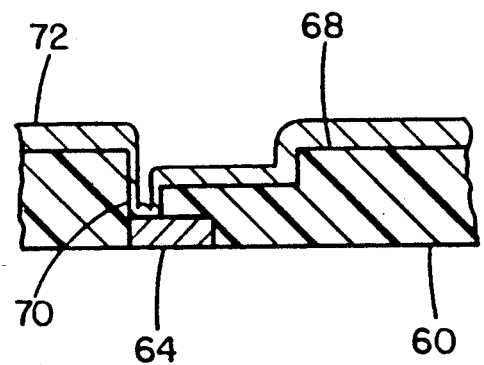
FIG.4a  FIG.4b
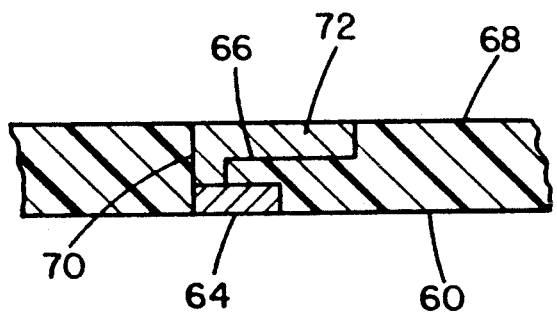
FIG.4c

LASER ABLATION DAMASCENE PROCESS

DESCRIPTION

1. Technical Field

The present invention relates to a laser ablation process, and more particularly relates to a novel laser ablation damascene process for the planarizing of metal/polymer structures. More specifically, the process is especially adapted for the fabrication of both interlevel via metallization and circuitization layers in integrated circuit (IC) interconnects.

In order to attain the purpose of the inventive laser ablation damascene process, the latter contemplates the utilization of at least one laser pulse of specified intensity whereby depressions, generally consisting of holes or trenches formed in an insulating layer or substrate having a metal film or layer deposited thereon, to cause the metal overlayer to sufficiently fill the formed holes or trenches upon melting thereof responsive to the application of the laser pulse, with the laser simultaneously ablating metallic material from the surface of the polymer substrate surrounding the holes or trenches so as to planarize the substrate surface.

2. Prior Art

Although numerous laser ablation and planarizing processes of generally the type considered herein are known in the technology as being useful for planarizing surfaces and for the fabrication of interlevel via metallization and/or circuitization layers in IC interconnects, prior art laser processes and devices which are employed for this purpose are subject to limitations and drawbacks in their applications.

Thus, the imparting of laser irradiation to metal overlays for the removal of metal from the surface of an insulating substrate, is currently known from the publications by Zaleckas and Koo, in Applied Physics Letters 31, pg. 615, 1977; and Andrew, et al., in Applied Physics Letters 43, pg. 1076, 1983.

Furthermore, Magee, et al. U.S. Pat. No. 4,758,533 describes the utilization of a laser for the filling of grooves with a metallic material to form interconnecting vias in a non-conductive substrate. However, the process employed in this patent does not pertain to a removal of metallic material through the intermediary of laser pulses, or even through other means. The planarization as described in Magee, et al. merely refers to that resulting from the (laser driven) reflow of the metal deposited on the surface of the substrate.

Various so-called "laser-induced explosion" processes which are presently disclosed in the technology generally pertain to the aspect of irradiating a metal film which is superimposed on an insulating substrate or layer through the intermediary of a laser beam, and in which the transfer of heat from the irradiated metal film into the underlying polymer or substrate leads to a localized pressure burst which removes the metal from the surface of the substrate.

Donelon, et al. U.S. Pat. No. 4,684,437 discloses a selective metal etching process for metal/polymer structures, in which a laser pulse in the ultraviolet radiation range allows for the selective etching of metal lines by passage through a screen structure or mask which is superimposed on a substrate having a metal layer thereon. However, although this patent discloses a basic laser ablation process, there is no reference to an optimized laser ablation damascene process in which, through the application of at least one controlled laser pulse, vias and/or trenches etched in a substrate for metallization and circuitization will be substantially filled with the metal material from a metal overlay or film while the surface of the substrate or polymer has the metal simultaneously removed thereon in the surroundings about the vias or trenches in a planarizing process effected by the application of the at least one laser pulse.

Further patents in this technology, which disclose various types of processes and apparatus for planarizing metal-coated substrates, particularly through the application of laser planarization and polishing methods, may be ascertained in Kamiola, et al. U.S. Pat. No. 4,503,315; Noguchi, et al. U.S. Pat. No. 4,731,516; Saito U.S. Pat. No. 4,602,420; and Chow, et al. U.S. Pat. No. 4,789,648. Nevertheless, none of these patents disclose the utilization of a laser ablation damascene process for simultaneously substantially filling with metal vias and/or trenches formed in or etched into a polymer substrate to provide for the fabrication of interlevel metallization and circuitization layers in IC interconnects, in which the application of at least one controlled laser pulse will be adequate to cause the melting and depositing of metal to at least substantially fill the vias and trenches, and to simultaneously ablate excess metal from the substrate surface in the regions about the vias or trenches so as to produce a planarized surface.

SUMMARY OF THE INVENTION

In order to attain the foregoing, the present invention contemplates the provision of a novel and unique laser ablation damascene process of the type described herein, in which subsequent to the forming or etching of holes or depressions in a polymer insulating layer, a metal layer or film is deposited thereon for the purpose of fabricating vias or conducting lines for metallization and circuitization layers in IC connects. Complete filling of the vias or trenches in the polymer insulating layer by the metal is not required herein; however, the vias and trenches should be preferably at least substantially filled by the metal in order to achieve the desired results of the invention. Thereafter, the surface of the metal layer which has been deposited or superimposed on the polymer substrate through any suitable method known in the art (such as sputtering, vapor deposition or the like) is irradiated with at least one laser pulse, and possibly more laser pulses, which will cause the metal layer to melt and reflow and resultingly at least substantially fill the vias and trenches etched in the polymer substrate while simultaneously ablating the metal from the planarized surface of the substrate in the regions about the vias and trenches. This laser ablation damascene process, through appropriate correlation and optimization between the applied single laser pulse and the properties of the employed metal enables the attainment of a rapid and efficient and highly economical method of forming the interlevel metallization and circuitization layer for IC interconnects.

Accordingly, it is an object of the present invention to provide a novel and unique laser ablation damascene process for the at least substantial filling with a molten metal of vias and trenches formed or etched in a polymer substrate from a metal layer which has been superimposed on the substrate, and to concurrently ablate excess metal material from the surface of the substrate so as to planarize the latter while fabricating interlevel via metallization and circuitization layers in integrated circuit interconnects.

BRIEF DESCRIPTION OF THE DRAWINGS

The foregoing and other objects of the invention may now be more readily ascertained from the following detailed description of an exemplary embodiment of the novel laser ablation damascene process, taken in conjunction with the accompanying drawings; in which:

FIGS. 4a through 4c illustrate the sequence of steps for the inventive process utilized for the simultaneous via and circuitization metal filling and excess metal removal or planarizing through the application of a single laser pulse;

DETAILED DESCRIPTION OF THE PREFERRED EMBODIMENT OF THE INVENTION

Preferred Embodiment of the Invention

Figure 1A:
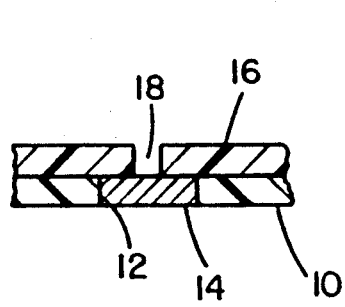
FIGS. 1a through 1c illustrate a sequence of process steps in a prior art damascene via metallization procedure.
Figure 1B:
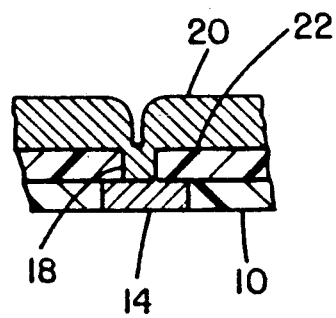
Figure 1C:
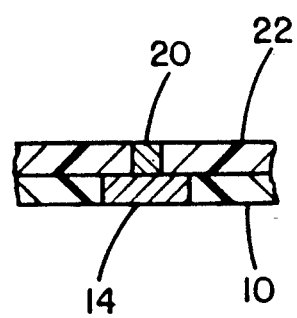

Referring now in more specific detail to the drawings, and particularly FIGS. 1a through 1c, there is disclosed a sequence in the steps of a typical prior art damascene process, to provide for via metallization, for example, in integrated circuit and microchip structures.

In that instance, a substrate which may be constituted from a suitable insulating material, such as a polyimide 10, has a cutout or a trench 12 etched therein and is adapted to be filled with a suitable electrically conductive metallic material 14, such as copper or the like, in order to fabricate an interconnect between circuitry in integrated circuit structures.

Superimposed on the substrate 10 is a layer of a non-conductive material 16, such as a polyimide, which may have a suitable via 18 etched therein communicating with the metal 14 present in the substrate 10. A further metallic material 20 is deposited on the surface 22 of the polyimide layer 16 so as to fill the via 18, thereby producing a metal-to-metal contact between the metal 20 in the via 18 and the first mentioned metal 14 contained in the trench in the substrate 10, as shown in FIG. 1b of the drawings. Thereafter, in a subsequent step, ordinarily through the application of a suitable polishing procedure, the upper surface 22 is planarized. The foregoing entails an expensive procedure requiring a multiplicity of process steps, and is essentially a time-consuming process.

Figure 2A:
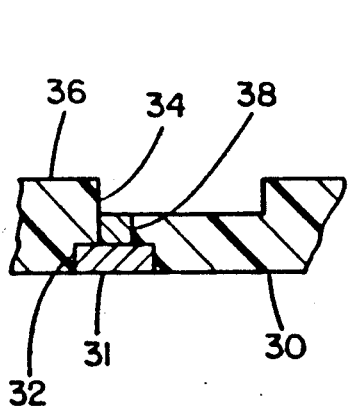
FIGS. 2a through 2c illustrate a sequence of steps for a typical prior art damascene process utilized for circuitization in an IC connect.
Figure 2B:
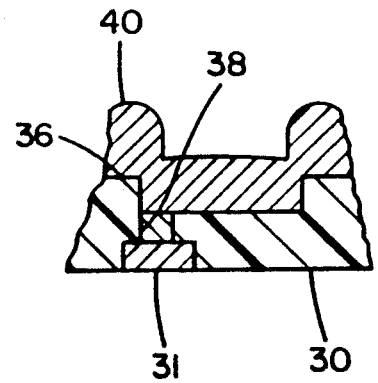
Figure 2C:
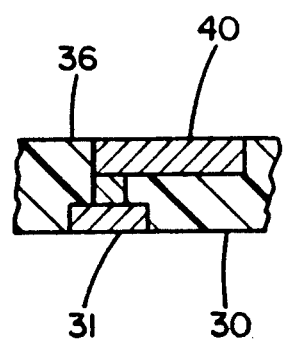

In the illustration of FIGS. 2a through 2c, in which the process is similar to that of FIGS. 1a through 1c, the insulator 30 has a trench 31 formed in the lower portion thereof and containing a metal 32, with a trench 34 forming a depression in the upper surface 36 of the insulator, the latter of which may consist of a polyimide, and with a via 38 communicating with the recess 34 and the metal 32 contained in the trench in the polyimide insulator 30.

As illustrated in FIG. 2b, metal 40 is deposited on the upper surface 36 so as to essentially completely fill the trench 34 and the via 38 and to come into contact with the metal 32 contained in the lower trench formed in the substrate 30. Thereafter, in a manner similar to that shown in FIG. 1c, referring herein to FIG. 2c, the upper surface 36 of the polyimide or non-conductive insulator 30 is suitably polished in order to remove excess material and to planarize the surface 36. Again, as heretofore, this particular prior art damascene process which is employed to impart circuitization layers in IC (integrated circuit) interconnects requires a plurality of process steps, thereby rendering the entire procedure time-consuming and expensive in nature.

In clear contrast with the prior art damascene processes as described hereinabove, the present invention provides for a laser ablation damascene process, having specific reference to FIGS. 3a through 3c, which essentially contemplates the formation or etching of a depression such as a via or trench in a substrate, and then at least substantially filling the depression with a metallic material and planarizing of the upper surface of the substrate or insulating material by ablating the metallic material simultaneously therewith in a single step through the application of at least one controlled laser pulse.

Figure 3A:
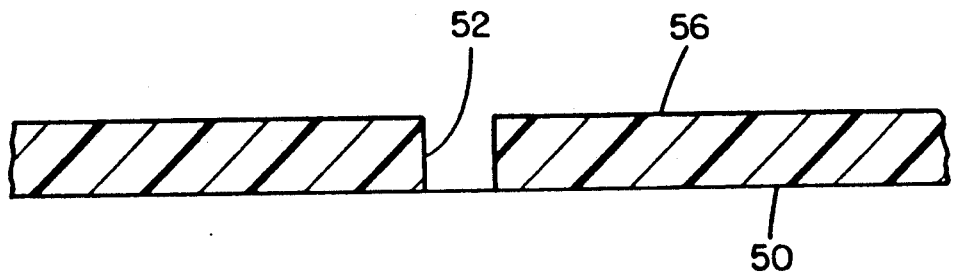
FIGS. 3a through 3c illustrate the sequence of steps utilized for the inventive laser ablation damascene process.
Figure 3B:
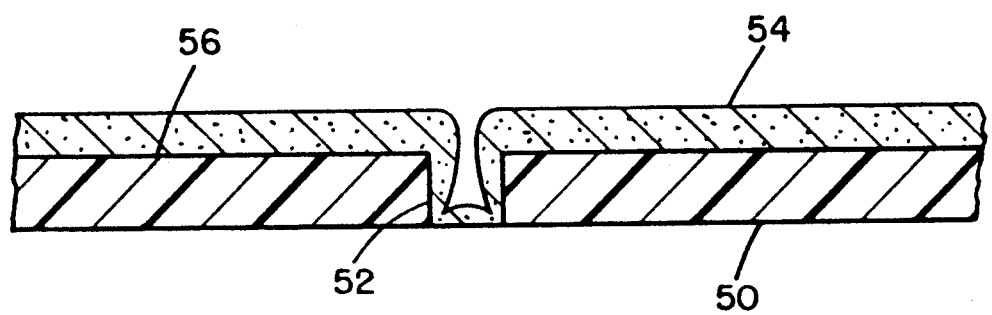
Figure 3C:
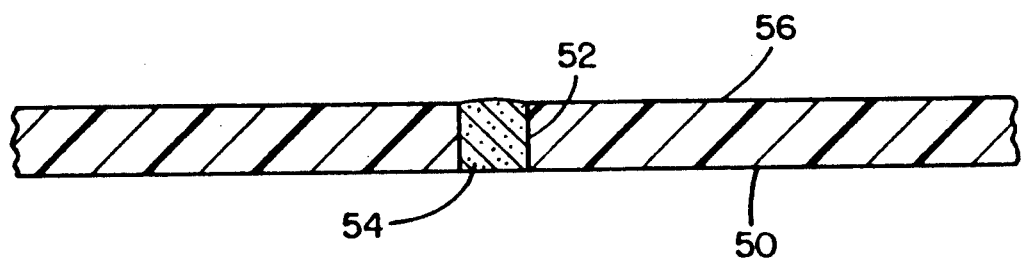

Pursuant to the basic concept of the inventive process, referring to FIG. 3a of the drawings, an insulator or substrate 50, which may consist of a polyimide or any other electrically-insulating material, has a hole or line 52 formed or etched therein so as to provide either a via or a trench normally utilized for metallization or circuitization. Thereafter, a layer of a metallic material 54 is applied onto the upper surface 56 of the insulating member 50, whereby there is no necessity for having to completely fill the via or trench 52. Upon the application of at least one laser pulse, or if necessary more than one laser pulse, from a suitable laser which has the fluency or energy thereof correlated with the properties of the metal layer 54 on the insulating material 50, the metal is melted so as to at least substantially fill the via or trench 52 while, simultaneously, the laser pulse will ablate; in essence, remove by melting or vaporization at a high temperature, the excess portion of the metallic material 54 which is present on the surface 56 of the insulating member 50 in the region about the hole or line 52, and thereby simultaneously planarizing the surface 56 and eliminating the presence of excess metal thereon in a single process step. Hereby, in accordance with the invention, the process may contemplate the ablating or removal of excess metal commencing from an initially planar metal surface. Moreover, the process may also be directed to the removal of excess metal through the application of multiple laser pulses, starting with or without the presence of a planar metal surface in the substrate.

Having reference to specific examples of the invention, in which the laser ablation damascene process is applied to a component for the fabrication of interlevel via metallization and circuitization layer structure in IC (integrated circuit) interconnects, FIGS. 4a through 4c illustrate the steps in applying the inventive process.

Referring to FIG. 4a, an insulator 60 which may be constituted from any suitable organic insulator material, preferably such as polyimide, has a bottom trench or recess 62 formed or etched therein for receiving a suitable electrically-conductive metallic material to produce an interconnect or circuit path for electrical circuitry. A depression or recess 66 formed in or etched into the upper surface 68 of the insulating material 60 includes a hole or via 70 which communicates with the metal 64 in the trench or recess 62.

Metal 72 in the form of a layer or film is deposited on the surface 68 of the insulator 60 so as to substantially cover the surface 68, and at least partly fill the recess 66 and into the via 70 which communicates with the metal 64. The metal 72 may be suitably deposited onto the insulator 60 through either sputtering, evaporative deposition or the like as is presently known in the technology for depositing a metallic film or layer on the insulator surface 68.

Thereafter, referring to FIG. 4c, at least one controlled laser pulse is applied to the metal 72, causing the latter to melt and to at least substantially, or even completely, fill the depression 66 and the via 70 and thereby contact metal 64, while simultaneously therewith, the laser pulse will ablate; in essence, melt at high temperature and vaporize the remaining portion of the metal 72 which is present on the surface 68, thereby planarizing the latter and removing the metal from the surface 68 in at least the surroundings about the recess 66.

Pursuant to an illustrative example and physical application for the fabrication of metallic interlevel via and circuitization layers in an IC interconnect pursuant to disclosed in FIGS. 4a through 4c, in essence, the insulator 60, consisted of a roughly $2\mu$ thick organic insulator material; for instance, polyimide layer. Suitable holes 70 and lines 66 in the form of vias and trenches were dry etched into the polyimide layer. Thereafter a metallic adhesion-promoting layer; for example, a $0.2\mu$ film of tantalum is deposited over the polyimide, and thereafter a bulk metal for example, a $3.2\mu$ film of copper is "depetch" deposited over the adhesion-promoting layer so as to form the metallic layer structure 72 covering the insulator surface 68. Other adhesion-promoting layers may include or consist of titanium, chromium and the like among various suitable metals.

Figure 5:
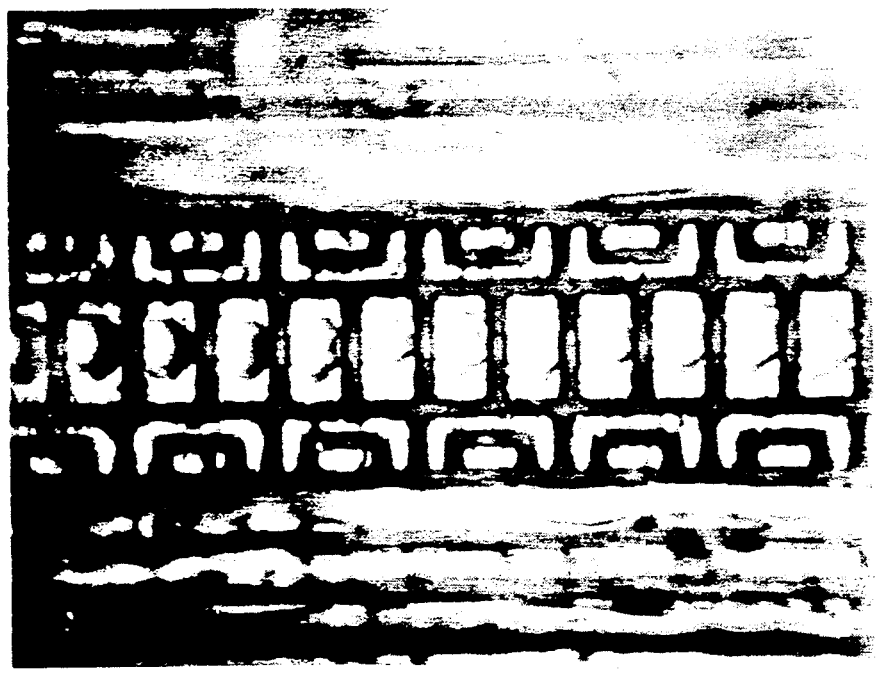
FIG. 5 illustrates, on a magnified scale, a plan view of an irradiated area of a component produced through the inventive laser ablation damascene process.
Figure 6:
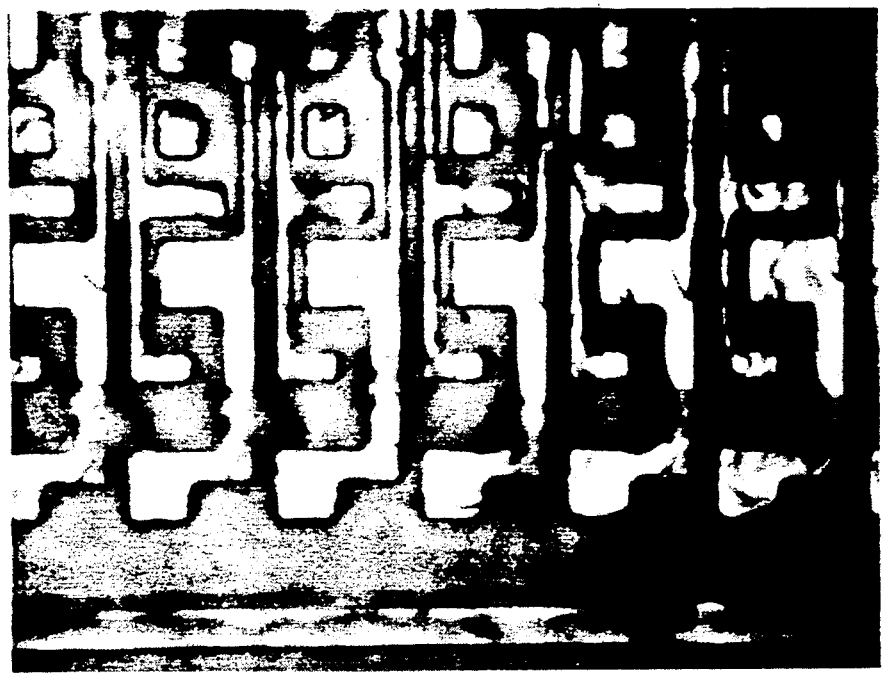
FIG. 6 illustrates, on a further enlarged scale, a plan view of another irradiated area produced pursuant to the inventive laser ablation damascene process.

Pursuant to the inventive laser ablation damascene process, in a specific sample, a $0.01 \text{ cm}^2$ area was irradiated with a single 15 ns long, 532 nm, $2.5 \text{ J/cm}^2$ visible laser pulse, produced by frequency doubling the $1.04\mu$ output of a pulsed infrared laser. This caused the concurrent filling of the depression with the resultingly molten metal, while the metal was simultaneously ablated by the laser pulse from the surface of the polyimide member so as to planarize the latter. As illustrated in the enlarged micrographs of FIGS. 5 and 6, the foregoing clearly indicates that the metal has reflowed and completely filled out the trenches, but has been ablated from the surface on the organic insulator or polyimide member surrounding the trenches in the depression through the application of the at least one laser pulse.

Hereby, it becomes readily apparent to one skilled in the art, that in the implementation of the inventive laser ablation damascene process, it is possible to contemplate the application of multi-layer metal films on the substrate for filling the depressions which are present therein.

In accordance with another example of the inventive process, 1.6 microns of copper were deposited by a depetch technique over damascene trenches in approximately 1 micron of silicon-dioxide. The trenches were etched through the oxide layer so as to contact the underlying silicon. Irradiation was effected with a single, 248 nm, 30 ns long, $4.5 \text{ J/cm}^2$ excimer laser pulse, resulting in the filling of the trenches and generally satisfactory removal of copper from the surface areas between the trench lines.

As shown by a further example of the process, 1.6 microns of Al 0.5% Cu was sputtered into 0.7 micron deep holes etched into approximately 1.0 micron thick silicon dioxide. Irradiation was implemented through a single, 248 nm, 30 ns long, $5.0 \text{ J/cm}^2$ excimer laser pulse. This resulted in the vias or holes being filled with aluminum-copper with the metal covering the surface of the substrate having been substantially removed.

Hereby, although the foregoing has been described with regard to a specific laser and metallic materials, the absolute and optimized values for the inventive laser ablation damascene process will vary with the particular metal, thickness, ambient temperature and laser wavelength utilized, whereby the laser wavelength should be selected to maximize absorption by the metal. Nevertheless, although a large degree of absorption would be desirable to render the process highly efficient, it is not an absolute necessity, and the choice of wavelength for the laser pulse for many metals may be relatively unimportant. Hereby, the laser pulse may be operated in either the ultraviolet, visible light or infrared range.

Moreover, the energy requirements of the laser may be reduced or relaxed by raising the temperature of the substrate prior to the application of the laser pulse; which in effect, will also enable enlarging of the process window through the selection of a suitable preheating temperature in conformance with the specific conditions which are encountered herein.

A further feature which is applicable to the inventive laser ablation damascene process resides in the provision of a device or structure for the removing or inhibiting the formation of debris, which is employed concurrently with the implementation of the laser ablation process. By way of example, although not limited thereto, this could contemplate the utilization of an inert gas flow for blowing away any produced debris; a vacuum aspirator to aspirate debris; an auxiliary laser beam to remove debris, or the like.

While there has been shown and described what are considered to be preferred embodiments of the invention, it will of course be understood that various modifications and changes in form or detail could readily be made without departing from the spirit of the invention. It is therefore intended that the invention not be limited to the exact form and detail shown herein and described, or to anything less than the whole of the invention herein disclosed and as hereinafter claimed.

Having thus described the invention, what we claim as new, and desire to secure by Letters Patent is:

1. A laser ablation damascene process for the planarizing of a surface on a substrate having a surface depression therein, comprising the steps of:
    (a) depositing a metal layer to at least partially fill said surface depression and to cover the substrate surface about said depression;
    (b) and applying at least one laser pulse having a fluence optimized in correlation with the characteristics of said metal layer for substantially filling said depression with said metal and concurrently substantially ablating the metal from the surface area on said substrate surrounding said at least one surface depression.

2. A laser ablation process as claimed in claim 1, wherein a plurality of said surface depressions form vias and trenches in at least one insulating layer of said substrate, said laser pulse melting said metal in said vias and trenches to produce metallization and circuitization layers in an integrated circuit interconnect.

3. A laser ablation process as claimed in claim 2, wherein said insulating layer is constituted from an organic insulator material.

4. A laser ablation process as claimed in claim 2, wherein said insulating layer is constituted from a polyimide.

5. A laser ablation process as claimed in claim 2 or 3 or 4, wherein said metal layer comprises an adhesion-promoting layer deposited on said insulating layer, and a layer of copper deposited on said metallic adhesion-promoting layer.

6. A laser ablation process as claimed in claim 5, wherein said polyimide has a thickness of about $2.0\mu$, said metallic adhesion-promoting layer has a thickness of about $0.2\mu$, and said copper has a thickness of about $3.2\mu$.

7. A laser ablation process as claimed in claim 5 or 6, wherein said metallic adhesion-promoting layer is selected from the group of materials consisting of tantalum, titanium and chromium.

8. A laser ablation process as claimed in claim 1, wherein said at least one pulse is a 15 ns long, 532 nm, 2.5 J/cm$^2$ visible laser pulse produced by frequency doubling the $1.04\mu$ output of a pulsed infrared laser.

9. A laser ablation process as claimed in claim 1, wherein said at least one pulse is a 248 nm, 30 ns long, 4.5 J/cm$^2$ excimer laser pulse applied to a 1.6 micron layer of copper deposited over damascene trenches in silicone dioxide etched to a depth through the oxide layer to contact the underlying silicon.

10. A laser ablation process as claimed in claim 1, wherein said at least one pulse is a 248 nm, 30 ns long, 5.0 J/cm$^2$ excimer laser pulse sputtered into 0.7 micron deep vias etched into approximately 1.0 micron thick silicon dioxide.

11. A laser ablation process as claimed in claim 1, comprising raising the temperature of said substrate to enable relaxing the energy requirements of the laser pulse and enlarge the window of said process.

12. A laser ablation process as claimed in claim 1, wherein said laser operates within wavelengths of either the ultraviolet, visible or infrared range.

13. A laser ablation process as claimed in claim 1, wherein debris formed during said process is removed concurrently with the application of said at least one laser pulse.

* * * * *